US007763211B2

(12) United States Patent
Rinderknecht et al.

(10) Patent No.: US 7,763,211 B2

(45) Date of Patent: Jul. 27, 2010

(54) METHOD AND APPARATUS FOR GENERATING LARGE PRESSURES ON A MICROFLUIDIC CHIP

(75) Inventors: Derek Rinderknecht, Arcadia, CA (US); Morteza Gharib, San Marino, CA (US); John A. Meier, Chickasha, OK (US)

(73) Assignee: California Institute of Technology, Pasadena, CA (US)

( * ) Notice: Subject to any disclaimer, the term of this patent is extended or adjusted under 35 U.S.C. 154(b) by 521 days.

(21) Appl. No.: 11/899,721

(22) Filed: Sep. 7, 2007

(65) Prior Publication Data

US 2008/0060700 A1 Mar. 13, 2008

Related U.S. Application Data

(60) Provisional application No. 60/842,880, filed on Sep. 7, 2006.

(51) Int. Cl.
*F17D 1/12* (2006.01)
*B81B 7/04* (2006.01)

(52) U.S. Cl. ........................... 422/100; 137/12; 137/14; 137/206; 137/561; 422/305

(58) Field of Classification Search ................. 422/305; 137/12, 14, 206, 561
See application file for complete search history.

(56) References Cited

U.S. PATENT DOCUMENTS

2002/0137229 A1 9/2002 Nishimura et al.
2005/0130292 A1 6/2005 Ahn et al.
2005/0232817 A1 10/2005 Ahn et al.

FOREIGN PATENT DOCUMENTS

EP 1 403 400 A1 3/2004
EP 1 442 787 A2 8/2004
WO WO 2004/048254 A1 6/2004

OTHER PUBLICATIONS

International Preliminary Report on Patentability and the Written Opinion of the International Searching Authority for PCT/US07/19484.

*Primary Examiner*—Jill Warden
*Assistant Examiner*—Timothy G Kingan
(74) *Attorney, Agent, or Firm*—Tope-McKay & Associates

(57) ABSTRACT

The present invention relates to a method and apparatus for generating pressure suitable in magnitude for powering micro-sized devices. The present invention typically comprises a gas generation chamber that is equipped with an activation element and filled with a gas-containing liquid. Powering of the activation element causes gas within the liquid to be released. Upon release a series of pressure distribution channels deliver the gas to a wide variety of peripheral microfluidic devices. A series of one-way valves and multi-chambered configurations allow for a wide variety of pressures to be generated from a single pressure generation device. By manipulating the scale of the pressure generation device, lab-on-chip, hand held, and bench top applications are possible and may readily be interfaced to allow a substantial amount of user control of the system.

18 Claims, 6 Drawing Sheets

METHOD AND APPARATUS FOR GENERATING LARGE PRESSURES ON A MICROFLUIDIC CHIP

PRIORITY CLAIM

The present application is a non-provisional patent application, claiming the benefit of priority of U.S. Provisional Patent Application No. 60/842,880, filed Sep. 7, 2006, titled, “A method for generating large pressures on a microfluidic chip.”

BACKGROUND OF THE INVENTION (1) Field of Invention

The present invention is directed to a system for generating a large pressure on a microfluidic chip and, more specifically, to a method and apparatus for generating pressure to drive and actuate microfluidic valves, pumps and other on-chip processes.

(2) Background

Recent developments in microfluidic technologies have enabled a variety of high-throughput biological assays to be performed on the surface of lab-on-chip devices. Microfluidic devices have characteristically small diameter channels and components, typically on the order of 100 micrometers (μm).

Suitable means to control and drive all the components for lab-on-chip applications are limited due to the size constraints of the field.

Common approaches for controlling flow throughout the lab-on-chips rely on the use of large external pressure sources, such as nitrogen bottles, to supply the pressure necessary to drive lab-on-chip operations. However, the very size of these external pressure sources greatly limits the portability of the lab-on-chip. Further, such large pressurized cylinders require vast amounts of time to assemble the interfaces between the cylinders and the micro-scale devices. The interface between the two systems normally requires steady hands, the use of magnification lenses, and micro-hole punches. Each interface must be configured manually, with each interface potentially critical to the functionality of the device. Additionally, the large pressurized cylinders often require compliance with stringent local and federal regulations to maintain the cylinders on the premises.

Referring to FIG. 1 an example of a microfluidic chip 100 which is interfaced with a large pressurized cylinder is shown. The microfluidic chip 100 includes a first reaction zone 102 and a second reaction zone 104. The first reaction zone 102 and the second reaction zone 104 perform similar functions and are typically redundant. The redundancy of the reaction zones 102 and 104 provide multiplexing capability. Each of the reaction zones 102 and 104 are fed from a number of feed lines 106, 108, and 110. The feed lines 106, 108, and 110 are embedded within the microfluidic chip 100 and transfer pressurized gas from external gas sources, such as cylinders, to the reaction zones 102 and 104. The feed lines 106, 108, and 110 are interfaced with the cylinders via connection tubes 112 and 114. Each of the connection tubes 112 and 114 require a substantial amount of time to interface with the micro-sized feed lines 106, 108, and 110.

As an alternative, chemical micro-pumps have been developed. The chemical micro-pumps produce pressure via chemical reactions to drive lab-on-chip processes. An example of such a pump was described by Yo Han Choi, Sang Uk Son, and Sueng S. Lee in “A micro-pump operating with chemically produced oxygen gas,” Sensors and Actuators, Vol. 111, Issue 1, March 2004, pages 8-13. The chemical micro-pumps use chemical reagents which are separated within the pump by a removable barrier. A wide of variety of chemicals have been proposed that will release a gas byproduct when mixed. The release of a gas is typically induced via a chemical reaction. In a closed or pressurized system, as the gas byproduct is released into a fixed volume, the magnitude of the pressure within the system increases.

The barrier is typically removed by applying heat and melting the barrier. Once the barrier is removed, the chemical reaction is initiated and takes place until the reagents are used up.

The pumping action of these devices is proportional to the amount of reagent available within the reaction chambers. Therefore, the reaction is wholly dependent upon the quantity of the reagents and can not be controlled once the reaction is initiated. The inconsistent availability of the reagents over time results in wide fluctuations in gas production. Similarly, the produced gas typically can not be sped up, slowed down, stopped, or varied. Although the chemical micro-pumps are inexpensive to fabricate, they are not reusable and therefore require a substantial amount of tooling time each time the pumps are exchanged.

As described above, existing methods fail to provide a portable and reusable device suitable for driving lab-on-chip processes. Therefore, a continuing need exists for an inexpensive and fully integrateable device for driving lab-on-chip processes. A further need exists for a device which can provide a constant pressure throughout the operation of the device. A still further need exists for a device which can produce a broad spectrum of pressures at a single time for distribution and which is controllable once the pressure generation system is initiated.

SUMMARY OF THE INVENTION

The present invention provides a method and apparatus for producing gas under pressure suitable in magnitude for distribution to a wide variety of micro-scale devices. The invention fulfills a long felt need for a single device which can provide a constant working pressure or a variety of working pressures which are then distributed to on board or peripheral devices.

In one aspect the present invention is a pressure generation device, comprising: a pressure generation chamber that includes: a gas containing liquid, the gas at least partially dissolved within the liquid; a hollow portion for retaining the liquid; an activation element in contact with the hollow portion, the activation element configured to induce the liquid to release the gas at least partially dissolved within the liquid to result in a released pressurized gas; and a pressure release port connected with the hollow portion for selectively distributing the released pressurized gas, whereby the released gas flows out of the hollow portion and past the pressure release port for distribution.

In a further aspect of the present invention, the activation element is a piezoelectric element.

In a still further aspect of the present invention, the activation element is selected from a group consisting of light emitting diodes (LED), lasers, capacitive devices, and resistive devices.

In yet another aspect, the present invention further comprises a separation element configured to separate the released pressurized gas from the gas containing liquid.

In another aspect, the pressure invention comprises: a fluid reservoir; and a reservoir valve having a first end and a second end, with the first end of the reservoir valve connected with the fluid reservoir and the second end attached with the hollow portion of the pressure generation chamber, whereby the hollow portion may be replenished by the fluid reservoir.

In another aspect, the pressure generation devices further comprises at least one pressure distribution channel for distributing the released pressurized from the hollow portion to peripheral and or external devices.

In another aspect, the present invention comprises: a pressure generation chamber configured to retain a gas containing liquid, the pressure generation chamber comprising: a hollow portion; an activation array in contact with the hollow portion, the activation array configured to release at least some of the gas from the gas containing liquid as a released pressurized gas; and a pressure release port connected to the hollow portion and the second end of the pressure distribution channel such that the pressure release port selectively allows the released pressurized gas to flow out of the hollow portion, through the pressure distribution channel and out the output port, whereby the introduction of a gas containing liquid to the hollow portion of the pressure generation chamber may be induced to release the pressurized gas contained within the liquid by energizing the activation array.

In a further aspect, the invention further comprises a user interface for informing a user to released pressurized gas from the pressure generation chamber.

In another aspect, the present invention further comprises a stage for receiving a microfluidic chip, the stage comprising: a support surface; an output port attached to the support surface; a pressure distribution channel, the pressure distribution channel having a first end and a second end, the first end terminated at the output port, whereby a microfluidic chip may be interfaced with the output port.

In yet another aspect, the present invention further comprises a second pressure generation chamber placed in series with the first pressure generation chamber, the second pressure generation chamber comprising: a second activation element having at least one activation element; a second hollow portion in contact with the second activation element; and a second pressure release port connected with the second hollow portion.

In a still further aspect of the present invention, the first pressure release port is a one-way valve that extends from the first hollow portion to the second hollow portion, thereby selectively distributing gas from the first hollow portion to the second hollow portion.

In a still further aspect of the present invention, the first pressure release port is a one-way valve that selectively distributes gas at a given pressure, the first pressure release port extending from the first hollow portion to a peripheral device.

In a still further aspect of the present invention, the pressure generation chamber further comprising: a user interface; a pressure sensor for sending signals to the user interface to monitor the magnitude of the released pressurized gas within the hollow portion; and a replenishment valve connected to the hollow portion.

In a still further aspect of the present invention, the activation element is a piezoelectric element in contact with the hollow portion, the piezoelectric element operable interacts with a gas containing liquid to cause the gas containing liquid to release at least some of the gas as a released pressurized gas.

In another aspect, the present invention further comprises a keypad configured to allow the user to pre-select the pressure at which the gas is released from the pressure generation chamber.

In another aspect, the present invention further comprises: a second pressure generation chamber placed in series with the first pressure generation chamber, the second pressure generation chamber comprising: a second activation element comprising an at least one activation element; a second hollow portion in contact with the primary activation element; an inter-chamber release valve joining the first pressure generation chamber from the second pressure generation chamber; and a second pressure release port for distributing pressure to a peripheral device, whereby the introduction of a gas containing liquid to the hollow portion of the pressure generation chamber may be induced to release at least some of the gas out of the gas containing liquid by energizing the activation element.

In another aspect, the present invention comprises acts of: obtaining a gas containing liquid; at least partially filling a pressurized hollow portion of a gas generation chamber with the gas containing liquid; selecting an at least one activation element; at least partially suspending at least one activation element within the hollow portion of the gas generation chamber; activating the at least one activation element within the hollow portion; releasing pressurized gas into the pressurized hollow portion; and distributing the released pressurized gas to a distribution network.

In yet another aspect of the present invention, the at least one activation element is selected from a group consisting of piezoelectric elements and heating elements.

In a still further aspect of the present invention, the invention further comprises an act of replenishing the gas containing liquid within the hollow portion of the gas generation chamber.

In yet another aspect, the present invention further comprises acts of: selectively releasing the pressure from the hollow portion to a second pressurized hollow portion once magnitude of the released pressurized gas reaches a predetermined level; selecting at least one second activation element; at least partially suspending at least one second activation element within the second hollow portion of the gas generation chamber; selectively activating the at least one activation element within the second hollow portion; increasing the magnitude of the released pressurized gas within the second hollow portion of the gas generation chamber; releasing pressurized gas into the pressurized second hollow portion; and selectively distributing the released pressurized gas to a distribution network via a one way valve.

BRIEF DESCRIPTION OF THE DRAWINGS

The objects, features and advantages of the present invention will be apparent from the following detailed descriptions of the disclosed aspects of the invention in conjunction with reference to the following drawings, where.

DETAILED DESCRIPTION

Figure 1:
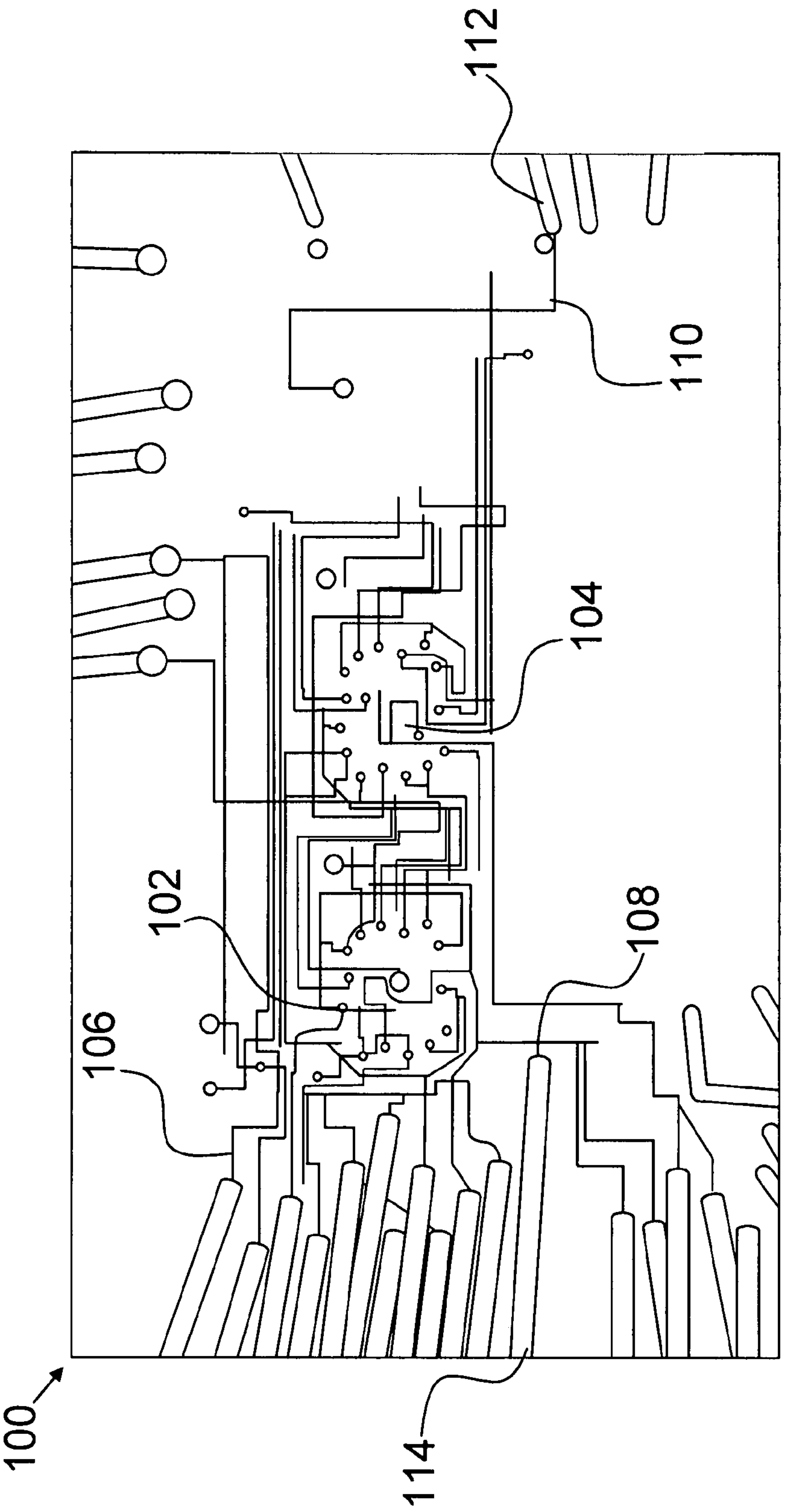
FIG. 1 is a illustration of a microfluidic chip with external interfaces.

The present invention relates to a method and apparatus for generating pressure suitable in magnitude for powering micro-sized devices. The present invention typically comprises at least one gas generation chamber equipped with an activation element and a series of pressure distribution channels for delivering gas of suitable magnitude to on-board or peripheral devices.

A single chamber pressure generation system provides an on-board energy source for lab-on-chip applications. Activation elements such as piezoelectric elements agitate a gas containing liquid and allow a single gas generation chamber to produce a wide variety of magnitudes of pressure. To vary the magnitude of the pressure generated, the duration of the working time or amplitude of the piezoelectric element is varied. In general, the longer the piezoelectric device is activated, the greater the magnitude of pressure. Conversely, the shorter the duration of working time, the smaller the magnitude of pressure that is generated. It should be noted that activation elements such as the piezoelectric element allow the device to be activated or turned off at will.

As an alternative, the principles of the single chamber pressure generation system may be incorporated into a multi-chamber generation system. The multi-chamber generation system is useful for reducing fluctuations in the pressurized gas output. The multi-chamber configuration also allows a continuous amount of pressure to be distributed to small and large systems alike.

The invention further allows pressures of varying magnitude to be generated in different chambers and distributed at a single time. Multi-chamber configurations also offer the ability to fine tune the output of released pressurized gasses, a feature not possible with many other gas generation devices.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 108, Paragraph 6. In particular, the use of "step of" or "act of" in the claims herein is not intended to invoke the provisions of 35 U.S.C. 108, Paragraph 6.

Figure 2:
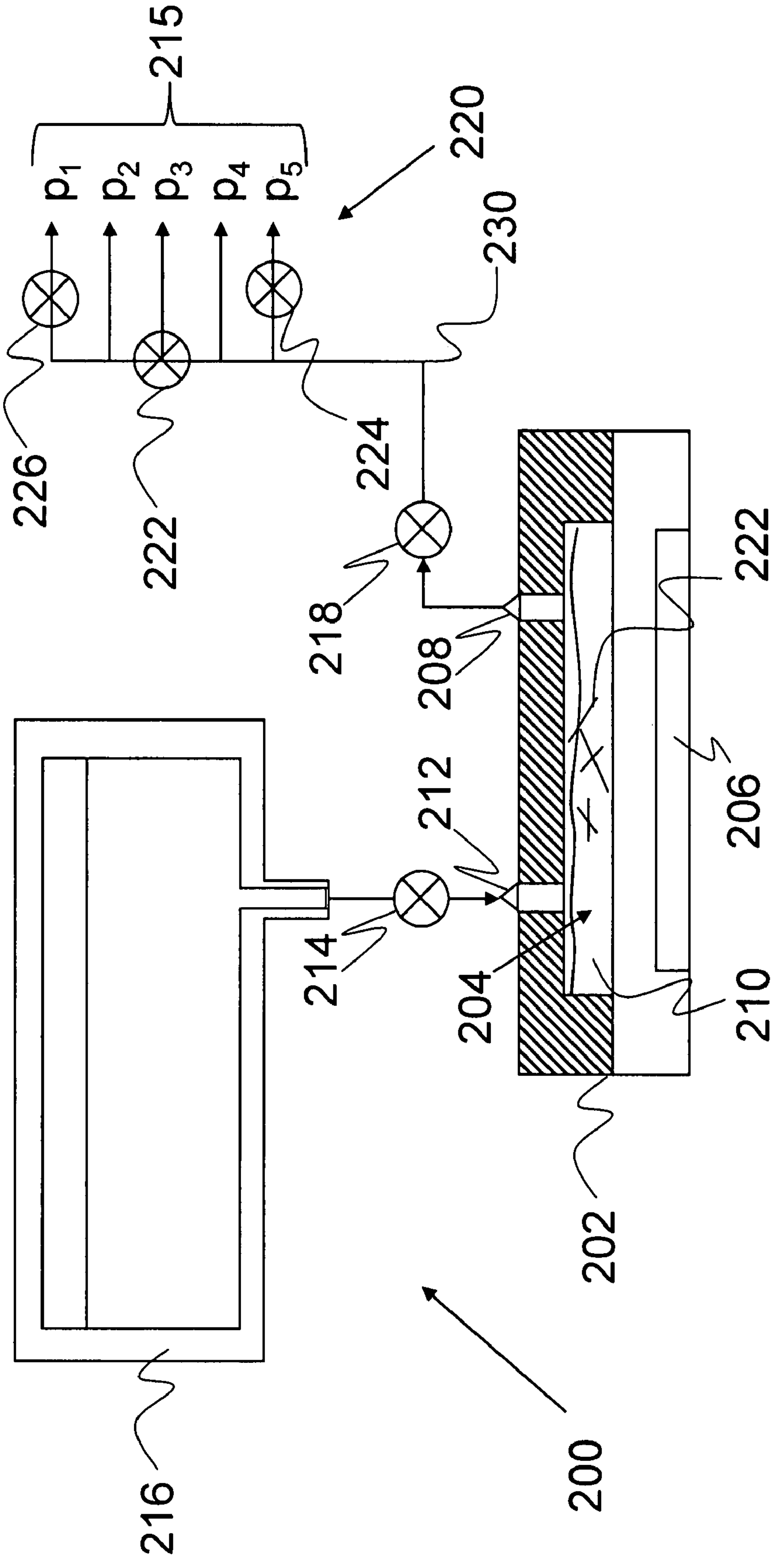
FIG. 2 is an illustration of the pressure generation device, pressure distribution network, and external fuel supply.

Referring to FIG. 2, a single-chamber gas generation device 200 is shown. The gas generation device 200 includes a single gas generation chamber 202 equipped with a pressurized hollow portion 204, an activation element 206, and a pressure release port 208. The gas generation device 200 typically retains a gas containing liquid 210 within the pressurized hollow portion 204 of the gas generation chamber 202; non-limiting examples of a suitable gas containing liquid 210 include carbon dioxide dissolved in water (carbonated water). Other materials such as solid and liquid chemical propellants may also be used; non-limiting example includes azobisisobutyronitrile (AIBN).

The surface of the gas generation chamber 202 is equipped with an input port 212 and input valve 214 for selectively replenishing the pressurized hollow portion 204 with fluid contained within a fluid reservoir 216. Although the input port 212 and input valve 214 are shown as separate devices, the devices (i.e., input port 212 and input valve 214) may be combined in certain applications.

The pressure release port 208 connects the pressurized hollow portion 204 of the gas generation chamber 202 to multiple peripheral devices 215 (such as peripheral devices $p_1$, $p_2$, $p_3$, $p_4$, and $p_5$) and may further be configured with a pressure release valve 218. The peripheral devices 215 are any suitable pressure-operated, on-chip, micro-device.

Particular activation elements 206 should be selected based upon the working environment. For certain applications where heat dissipation from the device is not a design concern, heating elements such as a light emitting diode (LED), lasers, resistive devices, or capacitive devices may be used. Heating elements in general are not as responsive to start and stop commands. To enhance responsiveness of the device 200, to start and stop commands incorporating agitation devices such as stepper motors and piezoelectric elements may be used as activation elements 206. The dimensions and number of the activation elements 206 may also be varied to suit particular applications. Although they are intended primarily to provide energy to the system for releasing gas and increasing pressure, many devices such as piezoelectrically actuated valves may be configured to release pressurized gas to external devices (e.g., $p_1$, $p_2$, $p_3$, $p_4$, and $p_5$). As another example, in multiple chamber embodiments, the devices may be configured to release pressurized gas from one gas generation chamber to another gas generation chamber.

Heating activation elements 206 work by heating the gas containing liquid 210. The increase in temperature causes the gas to expand, allowing micro-bubbles to form. Extended exposure to heat further induces growth of the gas bubbles, ultimately resulting in increased pressures within the pressurized hollow portion 204. Once the pressure rises to a desired level, a release port 208 allows the released pressurized gas to flow to the peripheral devices 215 (e.g., $p_1$, $p_2$, $p_3$, $p_4$, and $p_5$). The released pressurized gas may also be used to facilitate distribution of fluids to the peripheral devices 215 (e.g., $p_1$, $p_2$, $p_3$, $p_4$, and $p_5$). A variety of valves 218 have been contemplated to meet this objective.

As an alternative, the activation element 206 works by agitating the liquid. The mechanical energy from the activation element 206 is transferred to gasses present in the pressurized hollow portion 204. Suitable activation elements 206 include piezoelectric elements and any mechanical device which may be configured to agitate the gas containing liquid 210 inside pressurized hollow portion 204 of the gas generation chamber 202. Continued agitation induces further growth and therefore results in increased pressures for driving the peripheral devices 215 on a microfluidic chip. Once the pressure of the gas rises to a desired level, a release port 208 allows the pressure to flow to the peripheral devices 215. A variety of valves 218, 222, 224, and 226 may be incorporated into the design to ensure proper distribution of the released pressurized gas.

The pressurized hollow portion 204 of the single gas generation chamber 202 is pressurized to prevent seepage of the gas containing liquid 210 when subjected to elevated pressures. The gas may either be miscible or immiscible. In an alternative mode, the gas and the liquid 210 are both fluids which happen to be immiscible, meaning one is not dissolved in the other. Under certain pressures the gas within the liquid 210 may be partially dissolved within the liquid 210. An activation element 206, such as a piezoelectric element, may be focused in order to concentrate the emitted ultrasonic waves to a specific location within the pressurized hollow portion 204. Initiating of the activation element 206 provides the energy for cavitation of the partially or wholly dissolved gas within the hollow portion 204 to grow. To improve the efficiency of the cavitation within the pressurized hollow portion 204, porous or textured surfaces 222 are placed within the pressurized hollow portion 204 to create microenvironments in which bubble formation within the chamber is facilitated. A non-limiting example of such a textured surface 222 includes ceramic.

Although shown with a single activation element 206, a number of activation elements 206 may be used. Individual activation elements 206 of the same material may be coupled for synchronous use. As an alternative, the activation elements 206 may be functionally distinct, such as the use of a piezoelectric element to cause acoustic cavitation combined with a heating element to heat the gas containing liquid and therefore increase the pressure of the gas.

The pressure release port 208 may either be a single release port or a network of pressure release ports 208. Each pressure release port 208 is connected with at least one pressure distribution network 220 which allows the pressurized gas of a particular magnitude to be distributed to the peripheral devices 215. The distribution of the pressurized gas may be facilitated by a pressure release valve 218. The pressure release valve 218 may be an active valve, such as a one way valve configured to release the pressurized gas once the magnitude of the pressure within the pressurized hollow portion 204 reaches a predetermined magnitude, a non-limiting example of a suitable magnitude of pressure being 0.6 atm. The pressure release valve 218 may also be triggered by an electrical impulse to provide pressurized gas on demand.

Multiple pressure release valves 218 may be placed in series within the pressure distribution network 220, creating distribution channels between the various valves and peripheral devices 215. The valves 218, 222, 224, and 226 may be configured to retain an intermediate pressure within the distribution channels 230. An intermediate pressure in one aspect may be maintained by closing a first pressure release valve 218 and additional pressure release valves 222, 224, and 226 in series with the first pressure release valve 218.

Similarly, for distributing pressurized gas with minimal variation in magnitudes, the pressurized gas within the distribution channels 230 may be selectively distributed to the peripheral devices 215 by selectively opening the downstream valves 222, 224, and 226. Selectively opening the down stream valves 222, 224, and 226 ensures the pressurized gas within the pressure distribution network 220 will not drop significantly due to the increased volume of the distribution channels 230.

Further, by maintaining an intermediate pressure within the distribution channels 230, the pressurized hollow portion 204 may be exposed to ambient pressure without the pressure in the distribution channels 230 dropping. The pressure release valves 218, 222, 224, and 226 may also be selectively opened to allow particular pressures to be distributed to selected peripheral devices 215. For example, peripheral device $p_5$ may require a magnitude of pressurized gas far lower than that of peripheral device $p_3$. Once the magnitude of the pressure within the distribution channels is suitable for release, the pressure release valve 224 may be opened without dropping the magnitude of pressurized gas experienced by peripheral device $p_3$.

Figure 3:
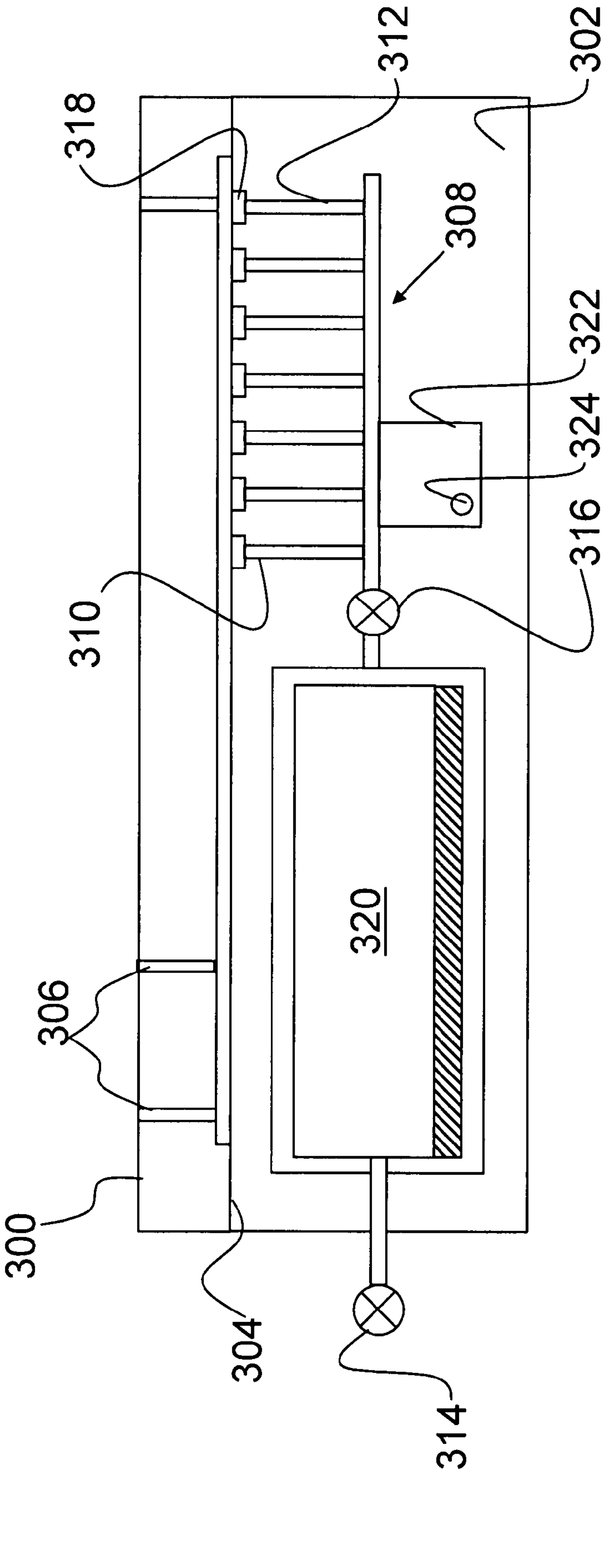
FIG. 3 is an illustration of a microfluidic chip with a fully integrated pressure generation system.

For further illustration, FIG. 3 depicts a side-view perspective of a microfluidic chip 300 with a fully integrated pressure generation device 302. The pressure generation device 302 comprises a surface 304 of suitable size and composition to allow for custom microfluidic networks 306 to be fabricated onto the pressure generation device 302. The relatively small size of the pressure generation device 302 and the standardized position of the pressure distribution network 308 offer the flexibility of a fully customized and portable microfluidic chip 300. As the magnitude of the gas pressure within the pressure generation device 302 increases, the gas is distributed to the first distribution channel 310 and second distribution channel 312. The location of the first distribution channel 310 and second distribution channel 312 also enhances compatibility with other microfluidic chips 300. Similarly the ability to manufacture a custom microfluidic chip 300 on the surface 304 of the pressure generation device 302 eliminates the burden of interfacing the microfluidic chip 300 to conventional large scale devices such as cylinders.

The pressure generation device 302 therefore provides a highly mobile device for true lab-on-chip applications. The microfluidic device 300 is primarily constructed by fabrication rather than manual manipulation. Fabrication is enhanced by the standardized placement of the first and second pressure release ports 310 and 312 to suite a wide variety of network configurations. A single release port 316 or a plurality of release ports 306 may be made available to maintain pressures throughout the microfluidic chip 300. A convenient recharge valve 314 is also included that allows the device to be continuously reused and pressurized, thus extending the life and usefulness of the microfluidic chip 300.

Each of the first and second pressure release ports 310 and 312 interface with the microfluidic chip 300 via a termination end 318. During manufacturing the termination end 318 may be filled with a dissolvable material to form plugs within the termination end 318. The dissolvable plugs are added to the channel termination ends 318 to prevent contamination of the f first and second pressure release ports 310 and 312. Upon completion of the manufacturing process, a fluid may be added to the hollow portion 320 and agitated to dissolve the plugs within the channel termination ends 318. Once the plugs have been dissolved, the entire system may be drained using the recharge valve 314. The pressure release ports 310 and 312 of the pressure generation device 302 may be manufactured by micromold, micromachining, etching or embossing.

The microfluidic chip 300 may also include a separation element 322. The separation element 322 is configured to separate liquid from the pressurized gas as it is released from the hollow portion 320 and distributed to the pressure distribution network 308. The separation element 322 collects the pressurized fluid that may escape the hollow portion 320 as the release port 316 is opened. The separation element 322 is shown as a basin for collecting the fluid. The separation element 322 may also be configured with a separation element release port 324 for draining the separation element. The separation element 322 may also be a filter placed either up stream or downstream from the release port 316.

Since there are no material constraints such a device can be micro-machined or etched into stiffer materials to be structurally rigid for high pressure operation, non-limiting examples of such materials include metals and silicon. The device may also be fabricated as a subcomponent within other systems using polymers through techniques such as soft lithography.

Figure 4A:
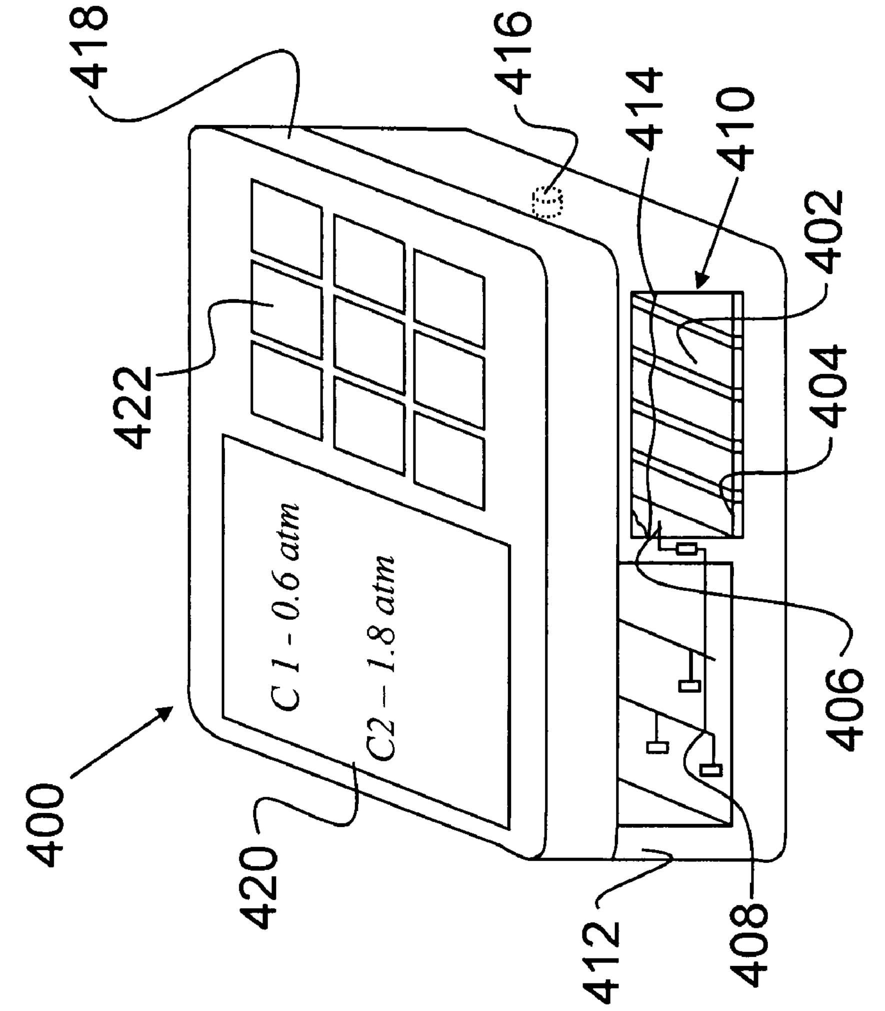
FIG. 4A is an illustration of a portable hand-held pressure generation device with a liquid crystal display (LCD) and user interface keypad.

Referring to FIG. 4A, a hand-held pressure generation device 400 is shown. As with other pressure generation devices, the mobile pressure generation device 400 has a hollow portion 402, an activation array 404, a pressure release port 406, and an attached pressure distribution network 408. The hand-held pressure generation system 400 provides a suitable amount of pressure to power a series of microfluidic chips at one time, or several chips over a long period of time.

The hand-held pressure generation system 400 includes a pressure distribution network 408 and a pressure generation chamber system 410, both of which are conveniently located within the bottom portion 412 of the device 400. A gas-filled liquid 414 is retained within the hollow portion 402 and provides the pressure required to feed the pressure distribution network 408. The hollow portion 402 may be user replaceable and readily exchanged with a full hollow portion 402 once the gas has been depleted from the system 400. Alternatively, the hollow portion 402 may also be replenished with additional pressurized gas, chemical reagent, or gas containing-liquid via the recharge valve 416. The recharge valve 416 may also be configured as a bleed valve to release pressure from the hollow portion 402. The top portion 418 of the pressure generation chamber 410 may include any suitable user interface; non-limiting examples of such interfaces include a graphical user interface 420 and a key-pad 422 interface.

The key-pad 422 when combined with a microcontroller allows the user to pre-select the magnitude at which pressurized gas is to be distributed to the pressure distribution network 408. The graphical user interface 420 may be programmed to guide the user through the selection process. The graphical user interface 420 may also be used to control the release of the pressurized gas to specific portions of the pressure distribution network 408. As an alternative the graphical user interface 420 may also be used to alert the user to useful data related to the distribution of fluids being propelled throughout the pressure distribution network 408; non-limiting examples of such data include quantity of fluid available, velocity of the fluid, and the external or peripheral devices being fed.

The activation array 404 typically includes a series of piezoelectric elements. The activation array 404 is set in series with spaces between each of the piezoelectric elements. As an alternative, a single piezoelectric element may also be used. The piezoelectric elements may contain either open perforations or may be accompanied by a valve, such as a one way valve, when multiple gas generation chambers 410 are used. Gas-containing liquid 414, which is agitated by the activation array 404, induces cavitation in the liquid. Continued operation of the activation array 404 provides the energy required to further expand the escaping pressurized gas from the liquid 414.

Figure 4B:
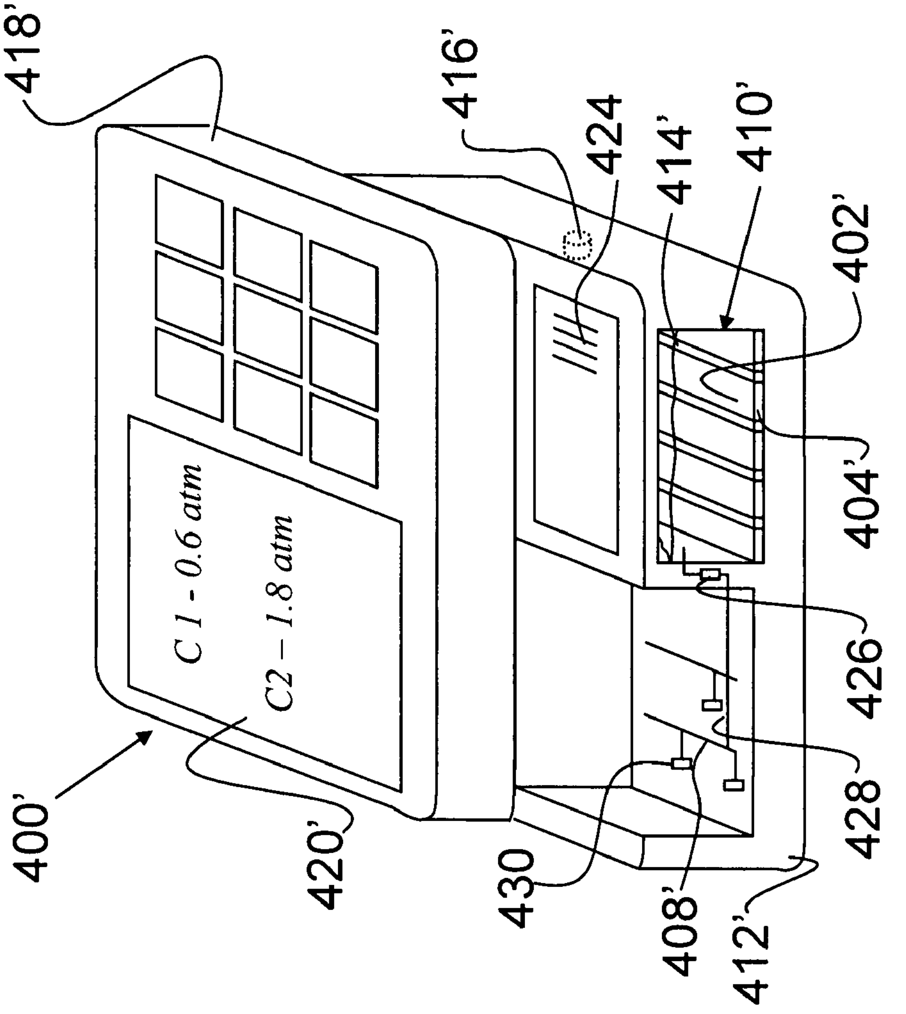
FIG. 4B is an illustration of the portable hand-held pressure generation device with the bottom portion extended outwards.

Referring to FIG. 4B, a hand-held pressure generation device 400' with a bottom portion 412' extended out from beneath the top portion 418' is shown. Above the hollow portion 402' is a series of electrical contacts 424 which electrically conduct power from the batteries contained within the top portion 418' to power the activation array 404' and integrated sensor system 426.

The integrated sensor system 426 provides feed back to the graphical user interface 420'. The integrated sensor system 426 also signals release ports 428 to release pressure generated in the hollow portion 402' to the pressure distribution network 408'. The keypad interface 422' selectively powers the activation array 404' to generate pressure by releasing pressurized gas from the gas containing liquid 414'. The integrated sensor system 426 provides feedback to a microcontroller with the information then being relayed to the graphical user interface 420'. The integrated sensor system 426 sends signals to the microcontroller that are related to pressure levels within the hollow portion 402'. The microcontroller uses this information to selectively activate, increase power, or deactivate the activation array 404'.

The integrated sensor system 426 may monitor the pressure directly or indirectly. Temperature may be used to indirectly measure pressure within the hollow portion 402'. Temperature may be directly extrapolated from the relationship between pressure and temperature using either an external device or built-in scale. For a variety of chemical reactions, another method of indirect measurement is accomplished by measuring the pH of the liquid 414'. Thus, the pressure may also be extrapolated using the pH measurement. A still further method of measurement is a pressure activated color sensor where the color of the sensor alerts the user to the pressure within the pressure generation chamber 410'. Audible alerts may also be utilized for this purpose.

The pressure distribution network 408' comprises a series of distribution channels 428 which distribute a wide range of released pressurized gas directly to an attached microfluidic chip. Alternatively the released pressurized gas may also be used in conjunction with fluids in order to propel the fluids throughout the distribution channels 428. Each of the distribution channels 428 may be equipped with channel termination ends 430. The channel termination ends 430 may either be active or passive valves. Passive valves distribute pressure to the attached microfluidic devices or chips as the pressure is generated within the pressure generation device 410' and released from the hollow portion 402'. A one-way pressure release valve 426 may serve to support an intermediate pressure between an attached microfluidic device and the pressure generation chamber 410'. Without the intermediate pressure, the pressure generation chamber 410' may be reduced to ambient pressure during recharging of the hollow portion 402'. For large applications, the intermediate pressure also enables the hollow portion 402' to be recharged via a recharge port 416' while simultaneously preventing the pressure of the distribution channels 428 from dropping. An intermediate pressure may also be contained within the pressure distribution network 428. This may be accomplished by closing the one-way pressure release valve 426 and one way valves configured within the channel termination ends 430.

Although a number of channel termination ends 430 are shown, in some applications, not all channel termination ends 430 interface with a microfluidic device. The channel termination ends 430 may be arranged in a standardized pattern. A standardized pattern allows custom microfluidic chips developed by others to be readily interfaced with the channel termination ends 430 of the pressure generation device 400'. The pressure distribution network 414' may also be configured to provide pressure to one or more microfluidic chips or devices having one or more inputs on each microfluidic chip or device.

Figure 5:
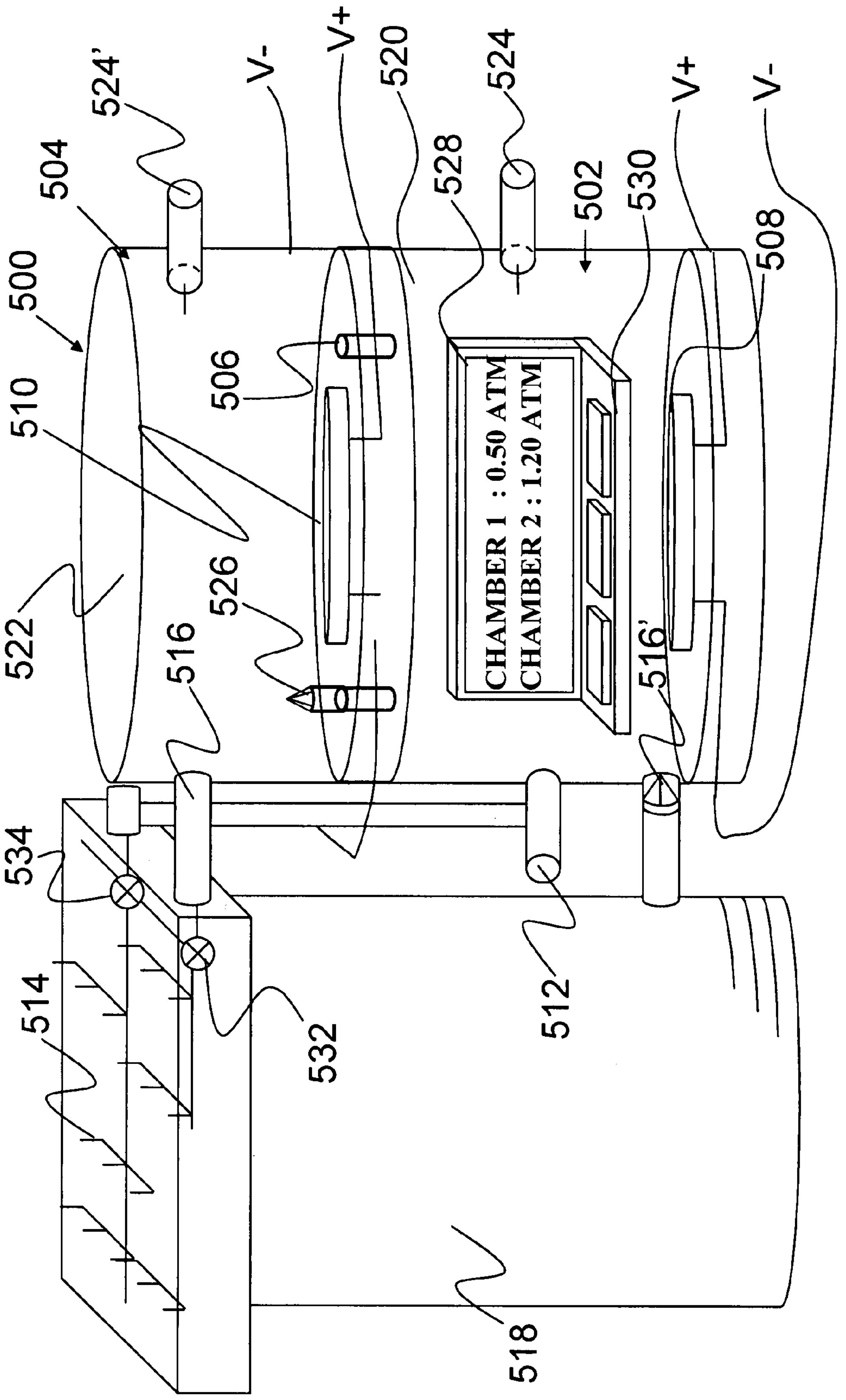
FIG. 5 is an illustration of a desk top pressure generation device with an LCD and user interface keypad.

Referring to FIG. 5, a multi-chambered gas generation device 500 is shown. Although shown as being substantially uniform in size and dimension, in practice the dimensions of the first gas generation chamber 502 and second gas generation chamber 504 may be varied to suit a particular application. The multi-chambered gas generation device 500 has many practical uses.

The first gas generation chamber 502 and second gas generation chamber 504 may be operated independent of each other to provide pressures of different magnitudes to different devices. In this mode of operation the inter-chamber release valve 506 connecting the first gas generation chamber 502 and second gas generation chamber 504 is closed, effectively preventing pressures generated in the first gas generation chamber 502 from seeping into the second gas generation chamber 504. A material, such as a gas field liquid, may be agitated by an activation element 508. As gas is released from the liquid, the pressure increases and is distributed out of the pressure release port 512. Similarly, pressure which has built-up in the second gas generation chamber 504 may be distributed to the pressure distribution network 514 via the pressure release port 516.

In one example, the first gas generation chamber 502 may be used to generate pressures of a smaller magnitude than those of the second gas generation chamber 504. Varying the number, size, position, duration of activity, and types of activation elements 508 and 510 within each gas generation chamber 502 and 504 are examples of suitable methods by which the magnitude of pressure generated by each chamber 502 and 504 may be varied.

A variety of mixtures, compounds, and solutions are readily employed within the spirit of the present invention in order to generate and distribute suitable pressures for driving peripheral devices. In one embodiment, two chemical reagents known to produce a gas byproduct when mixed together are initially separated. For example, one chemical reagent is held within a fluid reservoir 518 while a second chemical reagent is held within the hollow portions 520 and 522 of the gas generation chambers 502 and 504, respectively; non-limiting examples of such reagents include acids and bases. Similarly the fluid reservoir 518 may also contain a catalyst such as sodium-bicarbonate ($NaHCO_3$) while the hollow portions 520 and 522 may contain water. As an alternative the hollow portions 520 and 522 may also contain a gas containing liquid such as Hydrogen Peroxide ($H_2O_2$) while a catalyst such as $MnO_2$ may be distributed to the hollow portions 520 and 522 from the fluid reservoir 518.

When the pressure within the pressure distribution network 514 falls below a desired level, the fluid reservoir valves 516 and 516' may be selectively opened, allowing the reagents to mix and the gas byproduct to form. By providing an external fluid reservoir 518, each of the hollow portions 520 and 522 may be refilled as necessary. A wide variety of sensors 524 can be used to alert a central processor of the need for additional reagents to be released from the fluid reservoir 518. Integrated sensors 524 may also provide feedback to the user for manual activation of the system 500. Similarly, a system of circuits or a microprocessor may provide the user with preprogrammed or programmable logic for maintaining particular pressures throughout the system 500.

A series of stacked gas generation chambers 502 and 504 are filled with an at least partially dissolved gas within the fluid. Adjacent to, or integrated into, the bottom surface of each of the hollow chambers 502 and 504 are activation elements 508 and 510. The activation elements 508 and 510 may be selected from a variety of materials or devices, so long as they possess the properties of adding energy to the system. As mentioned above, examples of such materials or devices include piezoelectric elements, agitation devices, resistive elements, capacitive elements, light emitting diodes (LED), and lasers. The activation elements 510 may be adapted with a one way release valve to distribute a pressurized gas from a lower pressure generation chamber 502 to a pressure generation chamber 504 placed higher in the stack. The movement of the pressurized gas from one chamber 502 to another chamber 504 may also be facilitated by a passive inter-chamber release valve 506. Alternatively, the pressurized gas may be selectively distributed by an active inter-chamber release valve 526.

The pressures within each of the pressure generation chambers 502 and 504 is closely monitored using at least one sensor 524 and 524' within each of the hollow portion 522 and 524. The magnitude of pressure within each of the pressure generation chambers 502 and 504 may be closely monitored by the at least one sensor 524 and 524' and displayed on a graphical user interface 528, a non-limiting example of which includes a liquid crystal display (LCD). Additionally, a user interface, such as a key pad 530, allows the user to pre-select the desired pressures to be continuously sustained throughout the pressure distribution network 514. The sensors 524 and 524' within each chamber relay signals which may be used to regulate the pressures being distributed to the first and second one-way valves 532 and 534 of the pressure distribution network 514.

What is claimed is:

1. A microfluidic device, comprising:

a pressure generation chamber that includes:

a gas containing liquid, the gas at least partially dissolved within the liquid;

a hollow portion for retaining the liquid;

an activation element in contact with the hollow portion, the activation element configured to induce the liquid to release the gas at least partially dissolved within the liquid to result in a released pressurized gas; and a pressure release port connected with the hollow portion for selectively distributing the released pressurized gas, whereby the released gas flows out of the hollow portion and past the pressure release port for distribution; and a fluid reservoir; and a reservoir valve having a first end and a second end, with the first end of the reservoir valve connected with the fluid reservoir and the second end attached with the hollow portion of the pressure generation chamber, whereby the hollow portion may be replenished by the fluid reservoir.

2. The apparatus as set forth in claim 1, wherein the activation element is a piezoelectric element.

3. The apparatus as set forth in claim 1, wherein the activation element is selected from a group consisting of light emitting diodes (LEDs), lasers, capacitive devices, and resistive devices.

4. The apparatus as set forth in claim 1, further comprising a separation element configured to separate the released pressurized gas from the gas containing liquid.

5. The apparatus as set forth in claim 1, further comprising an at least one pressure distribution channel.

6. A microfluidic device comprising:

a pressure generation chamber configured to retain a gas containing liquid, the pressure generation chamber comprising:

a hollow portion; and a fluid reservoir; and a reservoir valve having a first end and a second end, with the first end of the reservoir valve connected with the fluid reservoir and the second end attached with the hollow portion of the pressure generation chamber, whereby the hollow portion may be replenished by the fluid reservoir;

an activation array in contact with the hollow portion, the activation array configured to release at least some of the gas from the gas containing liquid as a released pressurized gas; and a pressure release port connected to the hollow portion and the second end of the pressure distribution channel such that the pressure release port selectively allows the released pressurized gas to flow out of the hollow portion, through the pressure distribution channel and out the output port, whereby the introduction of a gas containing liquid to the hollow portion of the pressure generation chamber may be induced to release the pressurized gas contained within the liquid by energizing the activation array.

7. The apparatus as set forth in claim 6, further comprising a user interface for informing a user to released pressurized gas from the pressure generation chamber.

8. The apparatus as set forth in claim 6, further comprising a stage for receiving a microfluidic chip, the stage comprising:

a support surface;

an output port attached to the support surface;

a pressure distribution channel, the pressure distribution channel having a first end and a second end, the first end terminated at the output port, whereby a microfluidic chip may be interfaced with the output port.

9. The apparatus as set forth in claim 6 further comprising:

a second pressure generation chamber placed in series with the first pressure generation chamber, the second pressure generation chamber comprising:

a second activation element having at least one activation element;

a second hollow portion in contact with the second activation element; and a second pressure release port connected with the second hollow portion.

10. The apparatus as set forth in claim 9, wherein the first pressure release port is a one-way valve that extends from the first hollow portion to the second hollow portion, thereby selectively distributing gas from the first hollow portion to the second hollow portion.

11. The apparatus as set forth in claim 9, wherein the first pressure release port is a one-way valve that selectively distributes gas at a given pressure, the first pressure release port extending from the first hollow portion to a peripheral device.

12. The apparatus as set forth in claim 6, the pressure generation chamber further comprising:

a user interface;

a pressure sensor for sending signals to the user interface to monitor the magnitude of the released pressurized gas within the hollow portion; and a replenishment valve connected to the hollow portion.

13. The apparatus as set forth in claim 12, wherein the activation element is a piezoelectric element in contact with the hollow portion, the piezoelectric element operable interacts with a gas containing liquid to cause the gas containing liquid to release at least some of the gas as a released pressurized gas.

14. The apparatus as set forth in claim 13, further comprising a keypad configured to allow the user to pre-select the pressure at which the gas is released from the pressure generation chamber.

15. A microfluidic device as set forth in claim 13, further comprising:

a second pressure generation chamber placed in series with the first pressure generation chamber, the second pressure generation chamber comprising:

a second activation element comprising an at least one activation element;

a second hollow portion in contact with the primary activation element;

an inter-chamber release valve joining the first pressure generation chamber from the second pressure generation chamber; and a second pressure release port for distributing pressure to a peripheral device, whereby the introduction of a gas containing liquid to the hollow portion of the pressure generation chamber may be induced to release at least some of the gas out of the gas containing liquid by energizing the activation element.

16. A method for generating pressure suitable for driving microfluidic devices comprising acts of:

obtaining a gas containing liquid;

at least partially filling a pressurized hollow portion of a gas generation chamber with the gas containing liquid;

selecting an at least one activation element;

at least partially suspending at least one activation element within the hollow portion of the gas generation chamber;

activating the at least one activation element within the hollow portion;

releasing pressurized gas into the pressurized hollow portion; distributing the released pressurized gas to a distribution network; and replenishing, from a fluid reservoir in fluid communication with the hollow portion, the gas containing liquid within the hollow portion of the gas generation chamber.

17. The method as set forth in claim 16, wherein the at least one activation element is selected from a group consisting of piezoelectric elements and heating elements.

18. The method as set forth in claim 16, further comprising acts of:

selectively releasing the pressure from the hollow portion to a second pressurized hollow portion once magnitude of the released pressurized gas reaches a predetermined level;

selecting at least one second activation element;

at least partially suspending at least one second activation element within the second hollow portion of the gas generation chamber;

selectively activating the at least one activation element within the second hollow portion;

increasing the magnitude of the released pressurized gas within the second hollow portion of the gas generation chamber;

releasing pressurized gas into the pressurized second hollow portion; and selectively distributing the released pressurized gas to a distribution network via a one way valve.

* * * * *